United States Patent
Mizsei et al.

(10) Patent No.: US 12,191,858 B2
(45) Date of Patent: Jan. 7, 2025

(54) THERMAL-ELECTRIC LOGIC INTEGRATED CIRCUIT AND USE OF SAID INTEGRATED CIRCUIT

(71) Applicant: BUDAPESTI MUSZAKI ES GAZDASAGTUDOMANYI EGYETEM, Budapest (HU)

(72) Inventors: Janos Mizsei, Budapest (HU); Jyrki Lappalainen, Oulu (FI)

( * ) Notice: Subject to any disclaimer, the term of this patent is extended or adjusted under 35 U.S.C. 154(b) by 137 days.

(21) Appl. No.: 18/013,600

(22) PCT Filed: Jun. 3, 2021

(86) PCT No.: PCT/HU2021/050038
§ 371 (c)(1),
(2) Date: Dec. 29, 2022

(87) PCT Pub. No.: WO2022/003379
PCT Pub. Date: Jan. 6, 2022

(65) Prior Publication Data
US 2023/0253968 A1    Aug. 10, 2023

(30) Foreign Application Priority Data

Jun. 29, 2020 (HU) .................................. P2000211

(51) Int. Cl.
H03K 19/23    (2006.01)
H03K 19/02    (2006.01)

(52) U.S. Cl.
CPC ............. *H03K 19/23* (2013.01); *H03K 19/02* (2013.01)

(58) Field of Classification Search
CPC ......... H03K 19/23; H03K 19/02; H01L 23/00
See application file for complete search history.

(56) References Cited

U.S. PATENT DOCUMENTS 3,461,272 A * 8/1969 Hirsbrunner ........... H03K 19/02
                                                    219/505
3,548,293 A * 12/1970 Hirsbrunner ........... H03K 19/02
                                                    219/505

(Continued)

FOREIGN PATENT DOCUMENTS

JP    2006173555        6/2006
WO   2013160709 A2    10/2013

OTHER PUBLICATIONS

Mizsei J et al: "Thermal Electronic Logic Circuit as Neuromorphic Element", 2018 IEEE 18th Intl Conf on Nanotechnology (IEEE-Nano), IEEE, Jul. 23, 2018, pp. 1-4, XP03313010, DOI:10.1109/NANO.2018.8626264 [Retrieved on Jan. 24, 2019].

(Continued)

*Primary Examiner* — Daniel D Chang

(57) ABSTRACT

The invention is based on the integrated application of a thermal-electric active device (phonon transistor). Phonon transistors consist of resistors that respond to temperature changes with a metal-insulator phase transition, or possibly other resistors suitable for heat generation. These resistors are thermally and electrically coupled to each other as needed, and are thermally and electrically insulated from each other. The thermal-electric system built in this way is suitable for the implementation of high-integration logic networks.

8 Claims, 3 Drawing Sheets

(56) References Cited

U.S. PATENT DOCUMENTS

Figure 1:
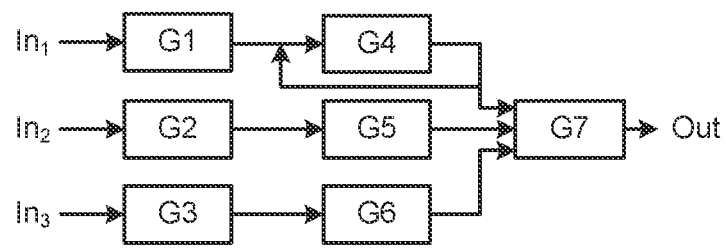

| | | | |
|---|---|---|---|
| 7,791,376 B2* | 9/2010 | Lim | H03K 19/20 |
| | | | 326/8 |
| 2006/0102927 A1 | 5/2006 | Fujita et al. | |
| 2007/0096071 A1 | 5/2007 | Kordus | |
| 2010/0066411 A1* | 3/2010 | Lim | H03K 19/20 |
| | | | 326/104 |

OTHER PUBLICATIONS

Intl Search Report, PCT/HU2021/050038, Oct. 13, 2021, 3 Pages.

* cited by examiner

THERMAL-ELECTRIC LOGIC INTEGRATED CIRCUIT AND USE OF SAID INTEGRATED CIRCUIT

The invention relates to a thermal-electric logic integrated circuit comprising at least two inputs, at least one output, and a series member connected to a supply voltage and consisting of a resistor and a further metal-insulator transition capable resistor used as a $VO_2$ switching element, where the at least one output is made up by the common point of the resistor and the metal-insulator transition capable resistor used as switching element of the series member, and where the at least two inputs comprise at least one electric input and at least one thermal input, whereas in case of a NOR logic gate circuit, the at least one input resistor constituting a thermal input of the gate circuit is arranged closer to the metal-insulator transition capable resistor used as the VO2 switching element of the logic gate circuit than a thermal diffusion length, in case of a NAND logic gate circuit, at least one input resistor constituting a thermal input of the gate circuit is arranged farther from the metal-insulator transition capable resistor used as the VO2 switching element of the logic gate circuit than a thermal diffusion length. The proposed thermal-electric logic integrated circuit can preferably be used inter alia for implementation of majority gates, extended majority gates, weighted majority gates, a circuit for grassfire algorithm and controlled multimode oscillator. The invention relates also to the use of the proposed thermal-electric logic integrated circuit in a multimode oscillator circuit as well as in a matrix circuit implementing a grassfire algorithm.

The most advanced high-integration logic networks (micro-processors) contain silicon-based complementary MOS (CMOS) elements (gates). CMOS circuits require twice as many MOS transistors as the number of their logic inputs. This characteristic, combined with the complexity of each MOS transistor, makes it impossible to significantly reduce the size of integrated circuits.

Many logic circuit functions to be used in practice, such as gate circuits, special multimode oscillators or, for example, a grassfire algorithm with CMOS circuit elements, are extremely difficult or virtually impossible to implement. The grassfire algorithm can be understood for example based on the university curriculum "Image-processing for advanced students" (Képfeldolgozás haladóknak) by Kálmán Palágyi, Typotex Kiadó, 2011, Chapter 4.1. Especially for gate-type circuits, with a larger number of inputs, the number of components required also increases very rapidly.

Patent specifications HU 1200249 A and WO2013160709 A2 disclose a logic circuit arrangement of two states according to its electrical resistance, comprising a thermally conductive element, a so-called phonistor, which can be switched between the two states by a quantity of heat energy, and a heating resistor connected to the thermally conductive element by means of an energy coupling, capable of generating thermal energy. Phonistors consist of resistors capable of metal-semiconductor phase transitions under the influence of temperature change; these resistors are connected to each other by thermal and electrical conduction, as required, and are separated from each other by thermal insulation and electrical insulation. In the referenced logic arrangement, the heating resistor is a logic-level logic input determined by the amount of heat energy on it, and the heat conducting element is a logic-level logic output determined by the amount of heat energy on it, thus a thermal-electric logic circuit, abbreviated TELC.

The number of components of thermal-electric logic circuits is half or less of those of CMOS systems fulfilling similar functions. In a TELC systems, logical information is also expressed by the electrical and thermal state of the gate; the information can be transmitted by heat transfer, i.e. by heat current, or by electrical current via a conductive wire. This is a completely new principle compared to the single, electricity-based bit representation used in conventional digital systems used previously, as each gate has two outputs: the electrical output can be negated or pondered, the vanadium oxide material (VO2 later in this description), capable of metal-insulator phase transition, abbreviated in English MIT, depending on the order of resistance and load resistance, while the thermal output is always pondered, see an article of J. Mizsei, J. Lappalainen, I. Ulbert: "Thermal electronic logic circuit as neuromorphic element", 2018 IEEE 18th International Conference on Nanotechnology (IEEE-NANO). Note that the metal-insulator phase transition is often referred to in the art as the semiconductor-metal transition identical with it.

In conventional electronic systems, heat generation and heat dissipation are parasitic side-effects; there are no known solutions for using heat generation, heat conduction and heat transfer as a basis for operation. Thus, in the cited patent, the thermal effect was considered only as an excitation option for the temperature-sensitive element. The basic idea of creating a thermal-electric logic integrated circuit according to the invention is that, in a complex analogue or digital thermo-electric circuit characterized by two signal representations and two signal transmission options within an integrated system, heat propagation can also be a carrier of information in addition to commonly used electrical quantities. Such and similar information transfers based on multiple physical quantities can extend the capabilities of both analogue and digital systems. The complex analogue or digital thermoelectric circuit may also include conventional (CMOS) electronic gates and thermoelectric gates.

Based on the above finding, the object, i.e. the realisation of a complex analogue or digital logic circuit which can no longer be achieved with conventional circuit elements for the reasons outlined above, has been solved on the one hand by a thermal-electrical integrated logic circuit comprising at least two inputs, at least one output, and a series member connected to a supply voltage and consisting of a resistor and a further metal-insulator transition capable resistor used as a $VO_2$ switching element, where the at least one output is made up by the common point of the resistor and the metal-insulator transition capable resistor used as switching element of the series member, and where the at least two inputs comprise at least one electric input and at least one thermal input, whereas in case of a NOR logic gate circuit, the at least one input resistor constituting a thermal input of the gate circuit is arranged closer to the metal-insulator transition capable resistor used as the VO2 switching element of the logic gate circuit than a thermal diffusion length, in case of a NAND logic gate circuit, at least one input resistor constituting a thermal input of the gate circuit is arranged farther from the metal-insulator transition capable resistor used as the VO2 switching element of the logic gate circuit than a thermal diffusion length, and in case of a majority logic gate circuit, all excitation input resistors are arranged at an identical distance corresponding to the thermal diffusion length from the metal-insulator transition capable resistor of the logic gate circuit used as the $VO_2$ switching element, thus excitation of 50% of the inputs results in switching; in case of an extended majority logic gate circuit, all excitation input resistors are arranged at an identical distance, less than the thermal diffusion length or greater than the thermal diffusion length, from the metal-insulator transition capable resistor used as the $VO_2$ switching element, thus common excitation of a given percent of the inputs results in switching; in case of a weighted majority logic gate circuit, at least one excitation input resistor is arranged at a distance smaller than the thermal diffusion length from the metal-insulator transition capable resistor of the logic gate circuit switching element, and at least two excitation input resistors are arranged at a distance greater than the thermal diffusion length from the metal-insulator transition capable resistor used as the $VO_2$ switching element, thus excitation of some inputs has a stronger effect and the excitation of some other inputs has a weaker effect in switching, and in case of a controlled multimode oscillator circuit an input of a switching stage connected in parallel with a series member consisting of a resistor and a metal-insulator transition capable resistor used as a $VO_2$ switching element connected to the output of a function generator is connected to an output formed by a common point of the resistor and the metal-insulator transition capable resistor of the series member, and the switching stage is arranged being in thermal feedback with the metal-insulator transition capable resistor used as the $VO_2$ switching element.

On the other hand, the object has been achieved by using the integrated logic gate circuit according to the invention in a multimode oscillator circuit according to claim 5 or in a matrix circuit implementing a grassfire algorithm according to claim 6. Preferred embodiments are listed in the dependent claims.

Figure 2:
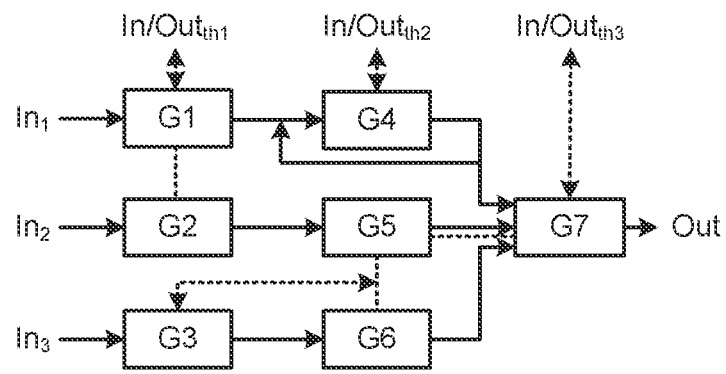
Figure 3:
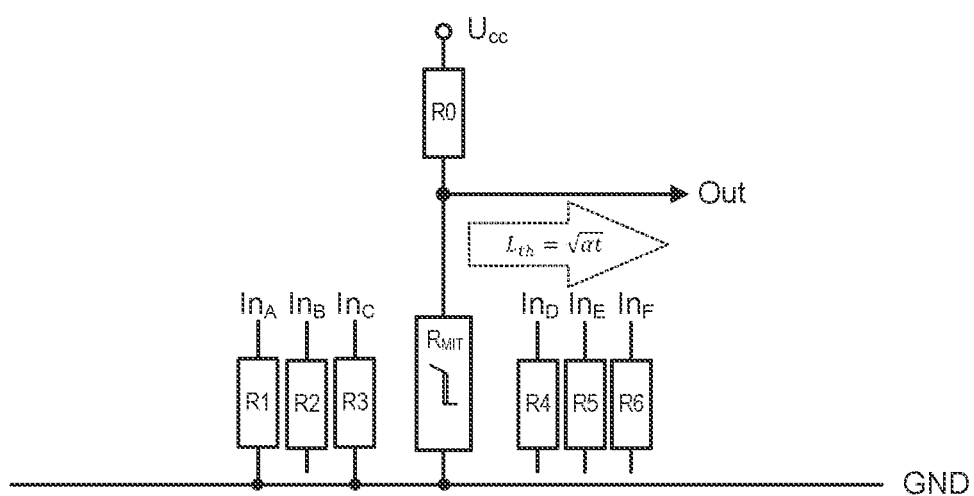
Figure 4:
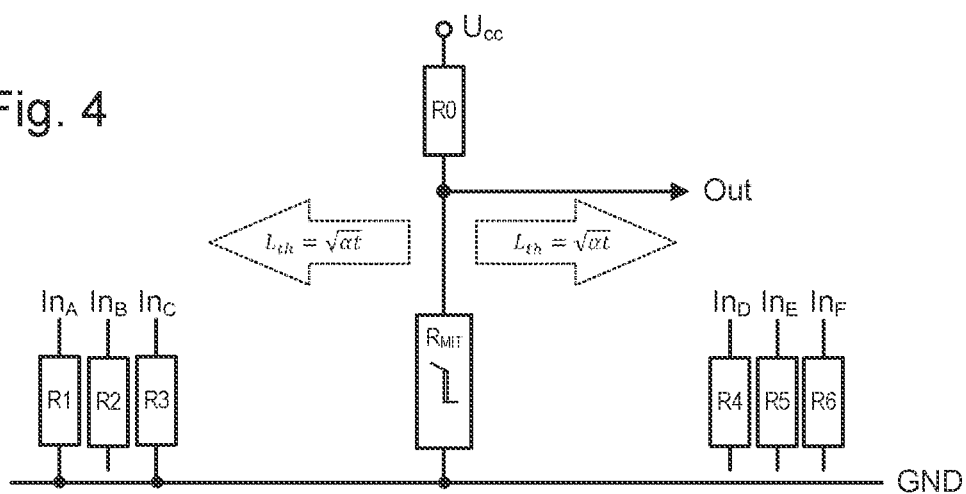
Figure 5:
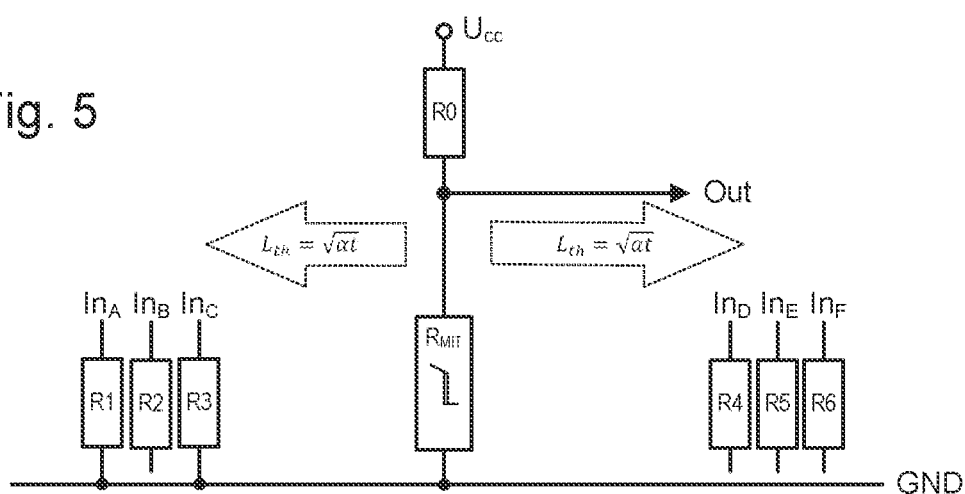
Figure 6:
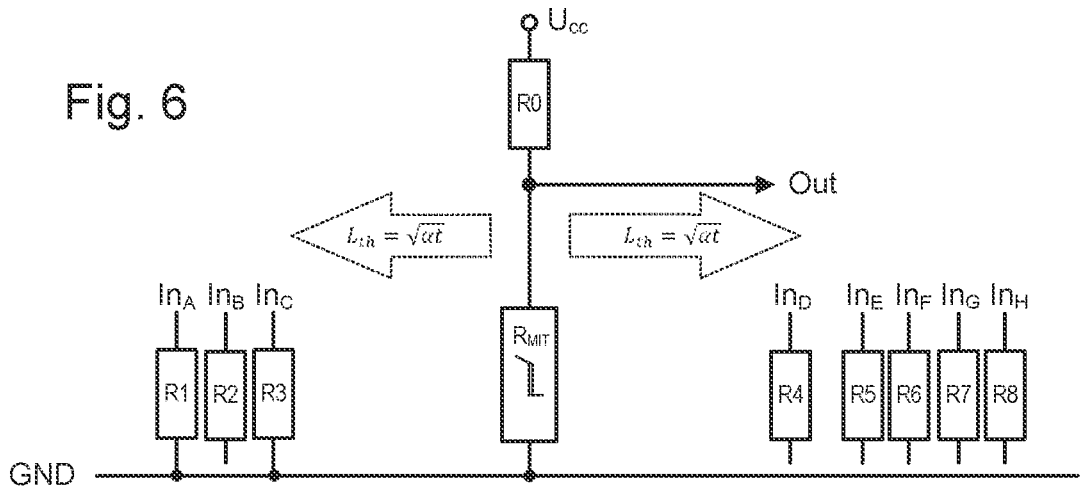
Figure 7:
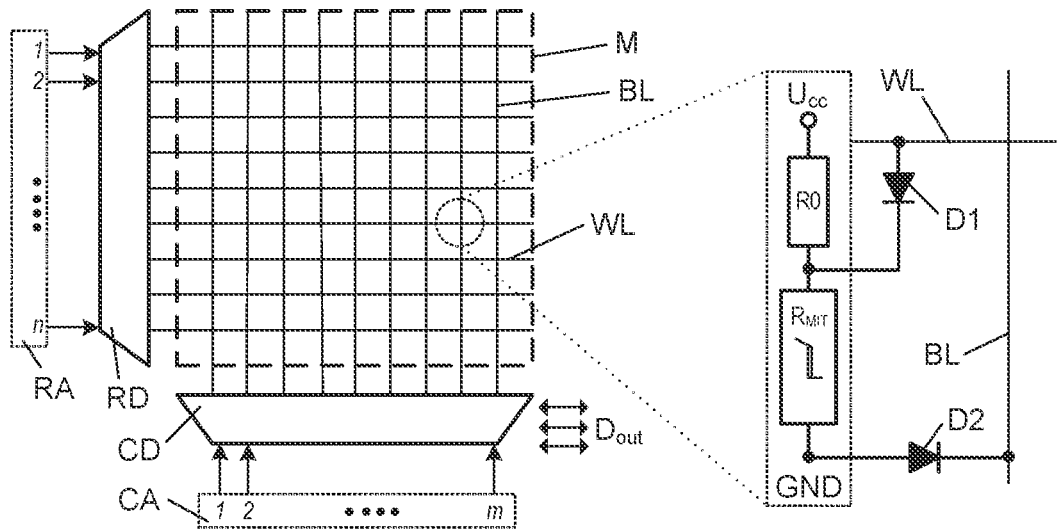
Figure 8:
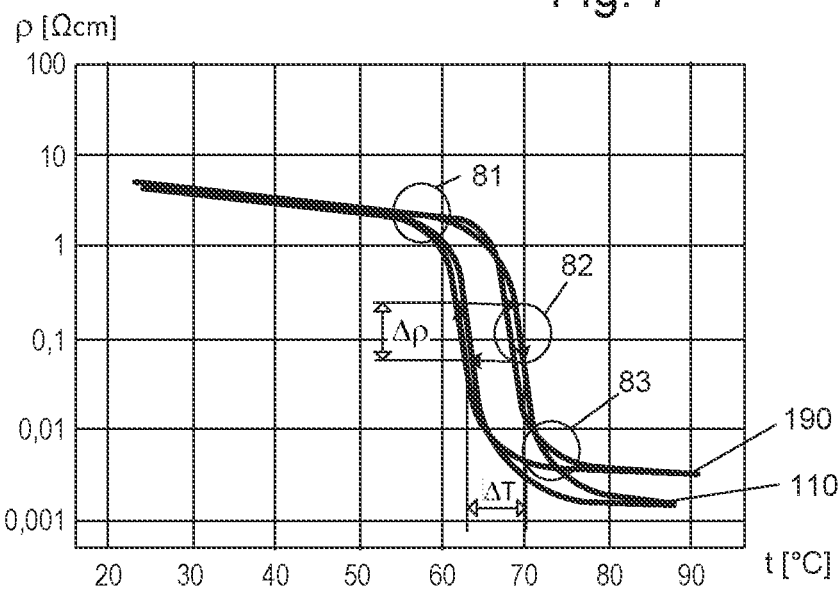
Figure 9:
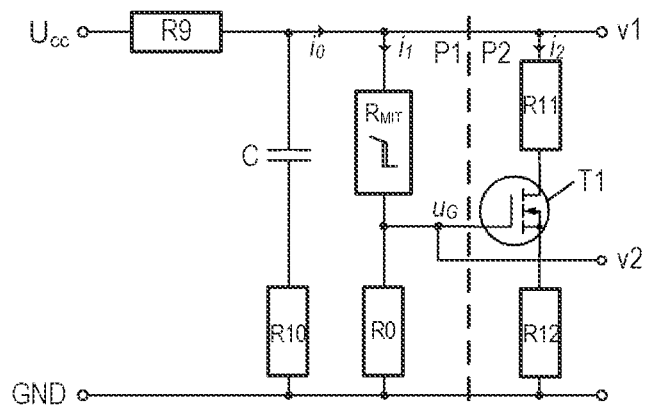

The invention will now be described in more detail with reference to exemplary embodiments of the circuit, with reference to the accompanying drawing, where FIG. 1 shows the structure and operation principle of a conventional digital logic electronic circuit, FIG. 2 shows the schematic diagram of a complex, analogue or digital thermal-electric circuit, characterized by two types of signal representation and two types of signal transmission possibilities within an integrated system, FIG. 3 shows the schematic layout of a thermal-electric NOR gate, FIG. 4 shows the schematic layout of a thermal-electric NAND gate, FIG. 5 shows schematically a thermal-electric extended majority gate, FIG. 6 shows schematically a weighted thermal-electric gate, FIG. 7 shows the schematic layout of a circuit arrangement implementing a grassfire in a thermal-electrical way, FIG. 8 shows the metal-insulator transition as a function of temperature, and FIG. 9 shows the schematic layout of a thermal-electric resistance-based controlled multimode oscillator circuit.

All elements of the thermal-electric logic integrated circuit according to the present invention are thermal-electric active devices, based on the integrated application of the phonon transistor (a phonistor that is a member of the family of neuristors and memristors.

FIG. 1 illustrates conventional digital electronic logic with electronic bit transmission. The electrical inputs $In_1$, $In_2$, $In_3$ are connected to gates G1, G2, G3 in the usual way, and the signal transmission between gates G1-G7 takes place via standard wiring, which is indicated by continuous lines. The output of gate G7 of the circuit shown here represents the output of the Out circuit.

FIG. 2 shows a complex digital thermal-electric circuit with electrical and thermal signal transmission. Electrical inputs $In_1$, $In_2$, $In_3$ are connected also here to gates G1, G2, G3, and signal transmission occurs also here between gates G1-G7 through standard wiring indicated by continuous lines, but in this circuit dotted lines indicate also the propagation of thermal signals communicating through thermal interfaces $In/Out_{th1}$, $In/Out_{th2}$, $In/Out_{th3}$. The construction of a sequential logic in a combination network requires electrical feedback, see FIG. 1, whereas a thermal feedback can result in sequential operation even without electrical feedback, cf. FIG. 2. It is stated that the memory effect is an essential property of thermal-electric circuits.

By precisely dimensioning the thermal-electric logic circuits and adjusting the strength of the thermal coupling, it is possible to activate a certain part of the input resistors, which are essentially heating resistors, to switch the output. This allows to set the switching threshold not only to 50% of the inputs, but also to a different value. The gate thus created is an extended majority gate.

By adjusting the strength of the thermal coupling, each input can have a different weight. The thermal-electric logic circuit implementation of most gates is much simpler than the traditional CMOS implementation; it is possible to take into account the different weights of each input and to implement a large number of inputs compared to conventional gates.

The thermal coupling strength can be described by the thermal diffusion length $L_{th}$, which depends on the time scale and the thermal properties of the material around the metal-insulator phase transition resistor used as the coupling element:

$$L_{th} = \sqrt{\alpha t}$$

where $\alpha$ is the thermal diffusivity, that is, thermal conductivity divided by the product of specific heat capacity and density.

FIG. 3 shows a schematic arrangement of a thermal-electric NOR gate. Resistors R1-R6 forming the inputs $In_A$, $In_B$, $In_C$, $In_D$, $In_E$, $In_F$ of the gate are arranged closer to a resistor $R_{MIT}$ with a metal-insulator transition capability, used as the switching element than the thermal diffusion length $L_{th}$; therefore, the thermal coupling is strong, and excitation of any resistor R1-R6 can result in switching, i.e. a resistor R0 connected to a supply voltage $U_{CC}$ and the output voltage of the common point of the resistor $R_{MIT}$ used as a switching element and connected to a ground GND changes from a logic high level to a logic low level. Same of the input resistors R-R6 can even act as load resistors for a previous gate, so their terminals are not necessarily grounded.

FIG. 4 shows a schematic arrangement of a thermal-electric NAND gate. Resistors R1-R6 forming inputs $In_A$, $In_B$, $In_C$, $In_D$, $In_E$, $In_F$ of the gate are arranged farther from the $R_{MIT}$ resistor used as a switching element than the thermal diffusion length $L_{th}$; therefore, the thermal coupling is poor and all input resistors R1-R6 must be excited (heated) to toggle the gate.

Based on the presented principle, a thermal-electric majority gate and a thermal-electric expanded majority gate can be formed. The extended majority gate is a generalization of the simple majority gate. To turn on a simple majority gate, half or most of the inputs must be at a high logic level. Boundary cases of the extended majority logic gate are the well-known "NOR/OR" gate where a logic 1, i.e. a high level, results in switching on at least one input, and a "NAND/AND" gate, where a logic high level of all inputs is required for switching on. The weighted majority gate contains inputs that affect the output with different efficiencies.

If all excitation input resistors R1-R6 are located at the same distance from the metal-insulator transition capable resistor $R_{MIT}$ used as the switching element, their effect on the switching process is the same. Very short distances result in a NOR gate, see FIG. 3, whereas distances greater than the thermal diffusion length $L_{th}$ result in a NAND gate, cf. FIG. 4.

If the distance between the excitation input resistors R1-R6 and the metal-insulator transition capable resistor $R_{MIT}$ used as the switching element is comparable to the thermal diffusion length $L_{th}$, 50% of the inputs needs to be excited for switching as shown in FIG. 5. This switch-on percentage can be increased as desired by increasing the distance, or can be increased up to 100% by thermal insulation between input resistors R1-R6 and the switching element (which actually results in a NAND gate). The switch-on percentage can also be reduced until the excitation, i.e. heating, of a single input resistor R1-R6 results in switching (which actually results in a NOR gate). For example, a ten-input extended majority gate set to a 10% switching threshold is actually a NOR gate; an extended majority gate set to a 100% switching threshold is actually a NAND gate. In this way, the majority gate function can be extended both upwards and downwards compared to the 50% threshold.

The effect of different excitation inputs can be influenced by using different distances or by changing the thermal diffusion, for example by heat conductive or insulating layers between groups of excitation elements and/or excitation elements and metal-insulator transition capable resistors $R_{MIT}$, an electric gate is a possible realization. For example, if the weighting factor is 0.5 for $In_A$, $In_B$, $In_C$, $In_D$ inputs and 0.25 for $In_E$, $In_F$, $In_G$, In inputs, then there are many options for input excitation, such as $In_a+In_c$, $In_b+In_d$, $In_a+In_d$, $In_c+In_d$, $In_d+In_e+In_f$, $In_E+In_F+In_G+In_H$, $In_D+In_E+In_F+In_G$, etc. can trigger the switching the output level.

In the schematic thermal-electric majority gate and extended majority gate arrangement shown in FIG. 5, there is a moderate thermal coupling between excitation input resistors R1-R6 and the metal-insulator transition capable resistor $R_{MIT}$ used as a switching element. At least 50% of the equally connected inputs may result in switching, or in the case of an extended majority gate, this percentage may be higher or lower if the same thermal coupling is tighter or weaker.

In the schematic thermal-electric weighted gate arrangement shown in FIG. 6, there is a different thermal coupling between the excitation input resistors R1-R8 and the metal-insulator transition capable resistor $R_{MIT}$ used as a switching element. Some of the input resistors R1-R8 must be excited in order for the switching to occur depending on the number of excited inputs and the weighting factor.

The integrated logic gate circuits described above can also be used in a matrix M implementing a grassfire algorithm, for example as shown in FIG. 7. The grassfire algorithm performs the transformation of two-dimensional shapes, such as images. The transformation results in a "skeleton" image created by the meeting of fire fronts launched from the lines of the original shape. The thermal-electric implementation of the grassfire algorithm can be used for image sensing, computer vision, image analysis and pattern recognition, as well as dynamic random access thermal memory.

To this end, the individual thermal-electric gates, i.e. the metal-insulator transition capable resistors $R_{MIT}$ used as switching elements are arranged together with pull-up resistors R0 and powered by a suitable supply voltage $U_{CC}$ in a two-dimensional matrix M consisting of n rows and m columns, so that the output of each thermal-electric gate is connected through a respective diode D1 to a corresponding word line WL connected to the output of a row decoder RD of known construction and operation and connected to the row addresses RA of the matrix M, and the output of the ground terminal GND of the metal-insulator transition capable resistor $R_{MIT}$ is connected through a diode D2 to a corresponding bit line BL connected to the outputs of a column decoder/multiplexer CD of known construction and operation connected to the column addresses of the matrix M. For proper processing of the data displayed on a data output $D_{out}$ of the column decoder/multiplexer CD, which is known to a person skilled in the art, the row decoder RD and column decoder/multiplexing CD are used as in conventional semiconductor memories. By properly organizing the arrangement implementing the grassfire algorithm, each thermal-electric pixel state can be excited and read. The first step of the operation is to upload the image to be processed. This can be accomplished by projecting and exposing an infrared image, either directly to the thermal-electric pixel matrix or by activating the pixels corresponding to the image using the aforementioned column decoder/multiplexers CD. When the pixel is turned on, Joule heat is generated; the heat flow propagates to the adjacent pixels, turning them on as well. In this way, these heat-coupled resistance systems MIT actually simulate the grassfire phenomenon. The spread of the fire front and the final state can be read out by means of the column decoder/multiplexers CD in a conventional manner.

FIG. 8 shows the effect of the metal-insulator transition, i.e. the change in resistance as a function of temperature. The figure shows a curve 110 of a 110 nm thick polycrystalline thin film resistor $R_{MIT}$ used as a coupling element, and a curve 190 of a 190 nm thick epitaxial thin film resistor $R_{MIT}$ as a function of temperature. The layers were formed on MgO(100) substrates. The area framed by the middle dashed line shows the most interesting part of the metal-insulator transition effect, where the metal-insulator transition from the insulator state indicated by a point 81 to the metal state indicated by a point 83 actually takes place at the thin-film resistor $R_{MIT}$. In the intermediate region, i.e. at a point 82, where the thin film resistor $R_{MIT}$ device is obviously of a highly complex state, both the insulating and the metallic state are present in the structure at the same time. In addition, the hysteresis of the metal-insulator transition effect is also clear, as shown by the range $\Delta T$ around point 82 in the FIG. 8. For example, if a thermal-electric oscillator described below is set to an irregular and chaotic mode, it will oscillate along some cycle, indicated by arrows around point 82, followed by a change in the metal-insulator transition capable resistor $R_{MIT}$. It should be pointed out that the physical origin of the hysteresis behaviour of such a reversible first-order phase transition is not fully known yet.

The operation of the thermal-electric logic integrated circuit according to the invention is also suitable for analogue signal processing, a possible example of which is the resistance $R_{MIT}$ based controlled multimode oscillator circuit design for the metal-insulator phase transition shown in FIG. 9. The controlled multimode oscillator has been designed to provide electrical feedback that can be used to adjust the operating point of the oscillator for any variety of modes, including stable two-level vibrations, multi-level vibrations, and irregular and chaotic vibrations. Some details of the oscillator circuit shown are known, for example, from J. Lappalainen, J. Mizsei, M. Huotari, "Neuromorphic Thermal-Electric Circuits Based on Phase Change VO2 Thin-Film Memristor Elements", Journal of Applied Physics 125 (2019) 044501.

The main point is an electrical feedback circuit for thermal-electric oscillator circuits that can be used to set the operating point of the oscillator for any of a variety of modes of operation, including (i) stable two-level vibration, (ii) multilevel vibration, and (iii) irregular and chaotic vibration. To accomplish this function, the electrical feedback circuit must be capable of setting and maintaining the operating point of the metal-insulator transition capable resistor $R_{MIT}$ used as the switching element around the specified state. This allows the oscillating circuit to be kept in a state where it oscillates in a controlled manner, or can be set at any other predetermined point around the metal-insulator transition. In the referenced article, the same functionality was achieved under laboratory conditions by an external gas flow for coarse temperature control of the circuits, more precisely for cooling, which is clearly not a reasonable solution for the practical operation of integrated circuits.

Since the metal-insulator transition effect in the thin-layer metal-insulator transition capable resistor $R_{MIT}$ based thermal-electric oscillator circuits is created by the Joule heating of the control current, a very accurate and fast control and feedback circuit is required to maintain thermal-electric oscillation. In addition, the control circuit must be capable of pre-setting the operating point of the thermal-electric oscillator circuit.

FIG. 9 shows a possible embodiment of an accurate and fast control and electrical feedback circuit of a thermal-electric oscillator. The complete circuit itself consists of two parts, namely a circuit part P1 known from the above-mentioned publication and a feedback circuit part P2. It is known from experiments that the circuit arrangement shown in circuit part P1 has several of the aforementioned oscillation modes and comprises a function generator and a series member of a metal-insulator transition capable resistor $R_{MIT}$ and a resistor R0 connected to the output of the function generator. The function generator consists of an RC member comprising a series capacitor C and a resistor R10 connected to the supply voltage $U_{CC}$ via a further resistor R9, the output of the function generator being the common point of the further resistor R9 and the capacitor C. The circuit part P2, which consists of a transistor T1 and two resistors R11, R12 connected in series, which are connected in parallel with a series member of a metal-insulator transition capable resistor $R_{MIT}$ used as a resistor R0 being the switching element and a transistor T1, its control electrode is connected to the common point of the output of the resistor R0 and the metal-insulator transition capable $R_{MIT}$ resistor used as the switching element, acts as an electrical feedback circuit and functionally replaces the active gas flow cooling, which plays an important role in said reference.

The circuit shown operates as follows:

When the supply voltage $U_{CC}$ is switched on, the thin-film metal-insulator transition capable resistor $R_{MIT}$ used as a switching element is in an insulating state of high-value, and the control voltage $U_G$ at the control electrode of the n-channel MOSFET transistor T1 is low, approximately $U_G \approx [R0/(R8+R0+R10)] \times V_{CC}$. Resistor R10 was chosen so that the control voltage $U_G$ is too low to open the transistor T1 at this point. Then the current $i_2$ in the feedback branch has a value of zero, and thus the circuit part P2 acts as an infinite resistance, i.e. an open circuit.

In this state, the circuit part P1 is the only active part. Capacitor C begins to charge through resistors R9 and R10. When the charge and voltage at the capacitor C are high enough, the thin-film metal-insulator transition capable resistor $R_{MIT}$ used as the switching element switches to the metal state so that its resistivity migrates from point 81 towards point 83 at point 82, and through the other intermediate stages (see FIG. 8). This is due to the heating effect of the current $i_1 \approx i_0$, i.e. the development of Joule heat.

Due to the transition from the insulator to the metallic state, a strong decrease in the resistivity $\rho(T)$ leads to the formation of a negative differential resistance (NDR) in the metal-insulator transition capable resistor $R_{MIT}$ used as a switching element, the voltage almost disappears and the control voltage $U_G$ rapidly increases to the value $U_G \approx [R0/(R8+R0)] \times V_{CC}$, which is enough to open transistor T1.

As a result of switching on transistor T1, current $i_2$ begins to flow through resistor R11, transistor T1 and resistor R12. As a result, the current of the metal-insulator transition capable resistor $R_{MIT}$ used as a switching element is significantly reduced to $i_1 \approx (i_0-i_2)$, and the dissipation is also greatly reduced on the metal-insulator transition capable resistor $R_{MIT}$ used as a switching element. As a result of the cooling, the specific resistance $\rho(T)$ of the thin-film metal-insulator transition capable resistor $R_{MIT}$ used as the coupling element returns to point 81 in FIG. 8 through the hysteresis transition.

When the value of the metal-insulator transition capable resistor $R_{MIT}$ used as the switching element increases again towards point 81, the control voltage $U_G$ starts to decrease, transistor T1 finally returns to the off state, and the state $i_2 \approx 0$ is set again. Capacitor C can then be recharged and the process starts from the beginning.

The oscillating behaviour of the circuit can be measured, for example, as the voltage change of the terminals v1 and v2 relative to ground GND. It is important to note that all resistors R9-R12 can be adjustable resistors. In particular, the resistor R0 can be used to set the point where the resistivity $\rho(T)$ starts from point 81 indicated in FIG. 8 towards point 83 during the transition from the insulating state to the metallic state. Resistors R11 and R12 can be of very small value, because the internal impedance of transistor T1 is very high in the off state. This arrangement increases the current $i_2$, which results in stronger cooling at the metal-insulator transition capable resistor $R_{MIT}$ used as the switching element when the transistor T1 is switched on. Resistor R10, on the other hand, can be used to set the charge time constant $\tau \approx C \cdot R10$ of capacitor C, which can be used to control the total oscillation period of the circuit.

During the experiments, logic gates and thermal supply lines were implemented. The operation of logic gates proves the feasibility of the majority gate and the extended majority gate, while the thermal supply line is essentially a one-dimensional implementation of the grassfire algorithm.

New features, such as the general chaotic oscillator, enable completely new information technology applications, very simply, in a small space and in a compact circuit arrangement and implemented.

Potential users of the devices incorporating the thermal-electrical integrated logic circuit according to the invention are primarily manufacturers and users of monolithic integrated circuits. Main advantages include that a majority gate, a weighted majority gate, and a multimode oscillator can play an important role in neuromorphic systems. The operation of extended majority logic based on weighted inputs based on a thermal-electrical logic circuit is similar to the operation of a neuron.

Thermal-electric circuits implementing the grassfire algorithm are also useful in image processing, noise reduction and computer graphics generator systems.

The structure of the thermal-electric circuit implementing the grassfire algorithm is similar to the structure of conventional semiconductor memories, so it can also be used as a dynamic random access thermal memory (DRAM) with an update cycle within the thermal time constant. The thermal-electric circuit implementing the grassfire algorithm can preferably be used for digital image processing, i.e. building a skeletal image for computer vision, image analysis, and pattern recognition. Because the pixels of the matrix of gates containing the $R_{MIT}$ resistor are sensitive to temperature, the solution is also suitable for infrared image sensing, where integrated image sensing and processing capability is a true neuromorphic feature of the system.

Logic gate circuits are operational in the kHz frequency range, in the 100 micrometre size range; the switching phenomenon reliably occurs in the MHz frequency range for characteristic micrometre sizes, and the metal-semiconductor phase transition reliably occurs in the micrometre-nanometre size range.

The controlled multimode oscillator circuit can have many economically important, conventional, as well as completely new applications and areas. In addition to traditional integrated oscillator tasks that generate various waveforms, it can be used in computational and decision-making applications of neural networks, neuromorphic and biological circuits such as medical research and the development of artificial intelligence technology. One very important area of application is information security and cyber security. Any commercial-type information can be important in a technological application in which a controlled multimode oscillator operating in an irregular and chaotic mode is capable of generating substantially unpredictable (pseudo) random numbers for cryptography and encryption of data.

LIST OF REFERENCE SIGNS $In_1$, $In_2$, $In_3$ electrical input
G1-G7 gate
Out output
$In/Out_{th1}$, $In/Out_{th2}$, $In/Out_{th3}$ thermal interface
$U_{CC}$ supply voltage
GND ground
$In_A$-$In_H$ input
R0-R12 resistor
$R_{MIT}$ resistor
$L_{th}$ thermal diffusion length
M matrix
RA line heading
CA column address
RD line coding unit
CD column decoder/multiplexer
BL bit line
WL word line
$D_{out}$ data output
D1, D2 diode
81, 82, 83 point
110, 190 curve
ΔT range Δρ specific resistance range
P1, P2 circuit part
C capacitor
T1 transistor
$i_0$ current
$i_1$ current
$i_2$ current
$U_G$ control voltage
v1, v2 terminal

The invention claimed is:

1. A thermal-electric integrated logic circuit, comprising:
at least two inputs ($In_A$-$In_H$, $In/Out_{th1}$, $In/Out_{th2}$, $In/Out_{th3}$),
at least one output (Out, $In/Out_{th1}$, $In/Out_{th2}$, $In/Out_{th3}$),
a series member consisting of a resistor (R0) and a metal-insulator transition capable resistor ($R_{MIT}$) used as a vanadium oxide ($VO_2$) switching element connected to a supply voltage ($U_{CC}$), and
where the at least one output (Out) is made up by the common point of the resistor (R0) of the series member and the metal-insulator transition capable resistor ($R_{MIT}$) used as the $VO_2$ switching element, and
where the at least two inputs ($In_A$-$In_H$, $In/Out_{th1}$, $In/Out_{th2}$, $In/Out_{th3}$) comprise at least one electric input ($In_A$-$In_H$) and at least one thermal input ($In/Out_{th2}$, $In/Out_{th3}$),
whereas
in case of a NOR logic gate circuit, at least one input resistor (R1-R6) constituting a thermal input of the NOR logic gate circuit is arranged closer to the metal-insulator transition capable resistor ($R_{MIT}$) used as the VO2 switching element of the NOR logic gate circuit than a thermal diffusion length ($L_{th}$),
in case of a NAND logic gate circuit, the at least one input resistor (R1-R6) constituting a thermal input of the NAND logic gate circuit is arranged farther from the metal-insulator transition capable resistor ($R_{MIT}$) used as the $VO_2$ switching element of the NAND logic gate circuit than a thermal diffusion length ($L_{th}$),
in case of a majority logic gate circuit, all of the excited input resistors (R1-R6) are arranged at an identical distance corresponding to the thermal diffusion length ($L_{th}$) from the metal-insulator transition capable resistor ($R_{MIT}$) of the majority logic gate circuit used as the $VO_2$ switching element;
in case of an extended majority logic gate circuit, all of the excited input resistors (R1-R6) are arranged at an identical distance, less than the thermal diffusion length ($L_{th}$) or greater than the thermal diffusion length ($L_{th}$), from the metal-insulator transition capable resistor ($R_{MIT}$) used as the $VO_2$ switching element;
further providing a weighted majority logic gate circuit, at least one excitation input resistor is arranged at a distance smaller than the thermal diffusion length ($L_{th}$) from the metal-insulator transition capable resistor ($R_{MIT}$) of the weighted majority logic gate circuit used as the $VO_2$ switching element, and at least two excitation input resistors are arranged at a distance greater than the thermal diffusion length ($L_{th}$) from the metal-insulator transition capable resistor ($R_{MIT}$) used as the $VO_2$ switching element.

2. The thermal-electric logic integrated circuit according to claim 1, wherein an input of a switching stage connected in parallel with a series member consisting of a resistor (R0) and a metal-insulator transition capable resistor ($R_{MIT}$) used as a $VO_2$ switching element connected to the output of a function generator is connected to an output formed by a common point of the resistor (R0) and the metal-insulator transition capable resistor ($R_{MIT}$) of the series member, and the switching stage is arranged being in thermal feedback with the metal-insulator transition capable resistor ($R_{MIT}$) used as the $VO_2$ switching element.

3. The thermal-electric logic integrated circuit according to claim 2, wherein the function generator is formed by a series RC member comprising a capacitor (C) connected to the supply voltage ($U_{CC}$) via a further resistor (R9) and a resistor (R10), where the output of the function generator is formed by the common point of the further resistor (R9) and the capacitor (C).

4. The thermal-electric logic integrated circuit according to claim 3, is used in a multimode oscillator circuit.

5. The thermal-electric logic integrated circuit according to claim 2, is used in a multimode oscillator circuit.

6. The thermal-electric logic integrated circuit according to claim 1, wherein the at least one output of each thermal-electric logic integrated circuit is connected through a respective diode (D1) to a corresponding respective word line (WL) connected to a respective output of a row decoder (RD) connected to respective row address (RA) of a matrix (M) implementing a grassfire algorithm, and the output of the ground terminal (GND) of the metal-insulator transition capable resistor ($R_{MIT}$) used as the $VO_2$ switching element of each thermal-electric logic integrated circuit is connected through a respective diode (D2) to a corresponding bit line (BL) connected to a respective output of a column decoder/multiplexer (CD) connected to respective column address (CA) of the matrix (M).

7. The thermal-electric logic integrated circuit according to claim 6, is used in a matrix (M) implementing a grassfire algorithm.

8. The thermal-electric logic integrated circuit according to claim 1, is used in a multimode oscillator circuit.

* * * * *